(12) United States Patent
Baker

(10) Patent No.: US 6,985,375 B2
(45) Date of Patent: Jan. 10, 2006

(54) ADJUSTING THE FREQUENCY OF AN OSCILLATOR FOR USE IN A RESISTIVE SENSE AMP

(75) Inventor: R. Jacob Baker, Boise, ID (US)

(73) Assignee: Micron Technology, Inc., Boise, ID (US)

(*) Notice: Subject to any disclaimer, the term of this patent is extended or adjusted under 35 U.S.C. 154(b) by 233 days.

(21) Appl. No.: 10/458,255

(22) Filed: Jun. 11, 2003

(65) Prior Publication Data
US 2004/0252543 A1 Dec. 16, 2004

(51) Int. Cl.
G11C 11/00 (2006.01)

(52) U.S. Cl. .................. 365/148; 365/196; 365/236
(58) Field of Classification Search .................. 365/148, 365/202, 196, 233, 236, 189.12
See application file for complete search history.

(56) References Cited

U.S. PATENT DOCUMENTS

| 6,504,750 | B1 | 1/2003 | Baker | |
|---|---|---|---|---|
| 6,822,892 | B2 * | 11/2004 | Baker | 365/148 |
| 6,826,102 | B2 * | 11/2004 | Baker | 365/207 |
| 2005/0018512 | A1 * | 1/2005 | Baker | 365/209 |

* cited by examiner

Primary Examiner—Richard Elms
Assistant Examiner—Hien Nguyen
(74) Attorney, Agent, or Firm—Dickstein Shapiro Morin & Oshinsky LLP

(57) ABSTRACT

A system and methods optimize the operation of sensing circuitry. In one embodiment, the output of a sensing circuit is stored in a register and processed through logic gates to determine whether the sensing output contains a predetermined string of logic ones or zeroes. If a string of ones is detected, the logic gates activate a counter to increase the operating clock frequency for the sensing circuit. If a string of zeroes is detected, the logic gates activate the counter to decrease the frequency.

41 Claims, 5 Drawing Sheets

ADJUSTING THE FREQUENCY OF AN OSCILLATOR FOR USE IN A RESISTIVE SENSE AMP

BACKGROUND OF THE INVENTION

The present invention relates to sensing devices, and more specifically to sensing circuits and related methods for sensing resistive memory cells.

BACKGROUND OF THE INVENTION

Digital memories are widely used in computers, computer system components and computer processing systems. Resistive memories store digital information in the form of bits or binary digits as "0"s or "1"s based on the resistance of a memory element or cell.

Resistive memory devices are configured in arrays where a resistive element or cell is at the intersection of a row line (or "word" line) and a column line ("digit" line or "bit" line). In order to read or sense the state of a memory cell, it is necessary to first select the desired memory cell by selecting the column line and row line, which intersect at the desired memory element. Once the desired memory element is isolated, the selected memory cell is then read by applying a read voltage to the cell. The applied voltage causes current flow through the selected cell which is sensed to determine the logic state of the cell. Sensing circuits often use digital counters which count a clock signal to establish a count value which is related to the current flow through the cell. An example of such an arrangement is illustrated in commonly-assigned U.S. Pat. No. 6,504,750, issued Jan. 7, 2003, titled "RESISTIVE MEMORY ELEMENT SENSING USING AVERAGING" which is incorporated by reference in its entirety herein.

Current sensing circuits used to measure memory cell resistances use clocked comparators and counting circuits and have a tendency to saturate, providing a continuous string of ones or zeroes. Typically, each type of string is a result of an incompatible clock oscillator frequency for received voltages which are related to current flow through the cell.

SUMMARY OF THE INVENTION

The present invention provides sensing methods and apparatus for adjusting the frequency of a clock oscillator used in a counting circuit for sensing resistive memory cells. In accordance with exemplary method and apparatus embodiments of the present invention, the output of a sensing circuit which produces "one" and "zero" counting pulses is processed to determine whether the sensing clock is operating at too low or too high a speed. If the speed is determined to be too low or too high, the clock speed is then adjusted as necessary to avoid saturation of the counting circuit.

Other features and advantages of the present invention will become apparent when the following description is read in conjunction with the accompanying drawings.

DETAILED DESCRIPTION OF THE INVENTION

Figure 1:
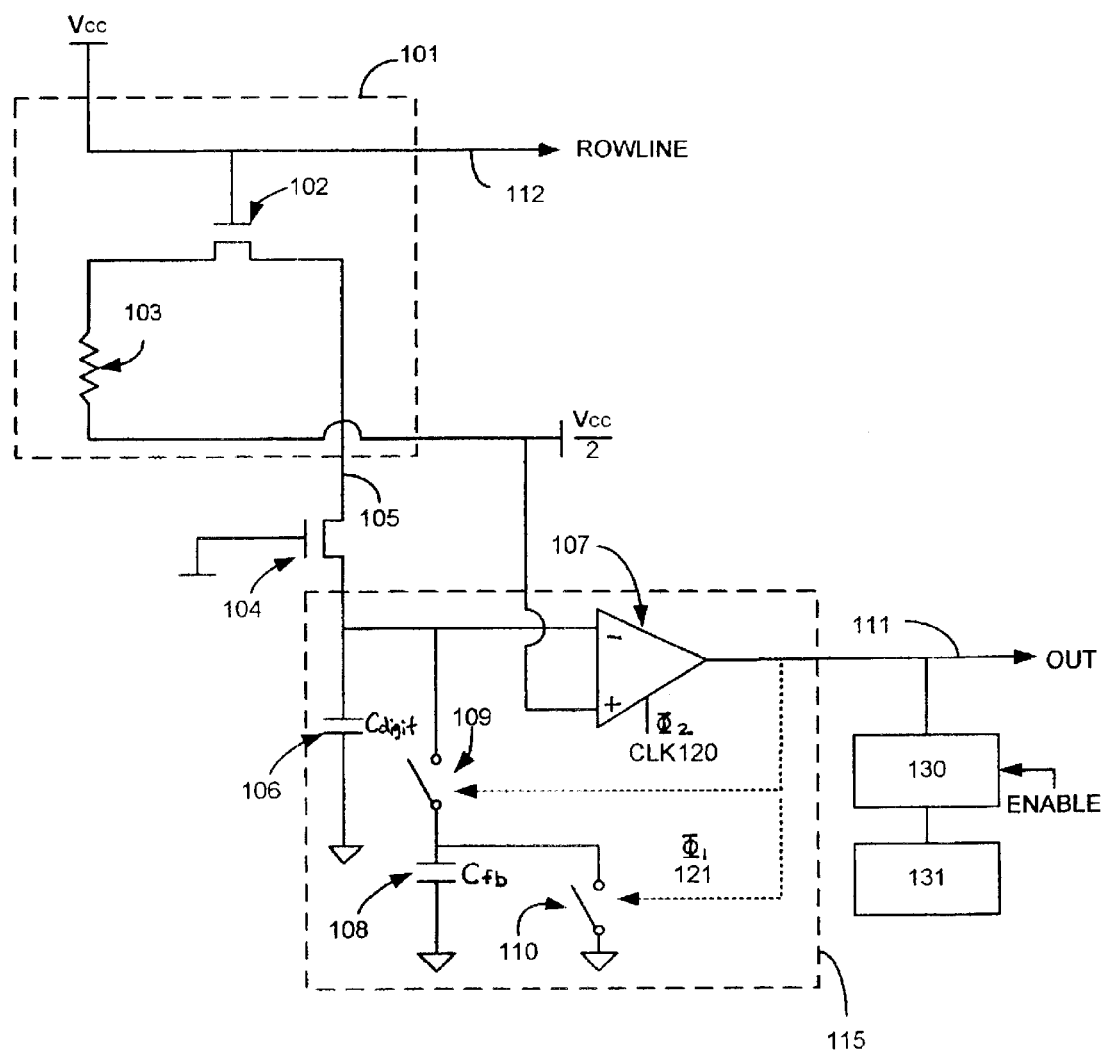
FIG. 1 is a schematic illustrating an exemplary sensing circuit, coupled to a resistive memory, in accordance with an exemplary embodiment of the invention.

FIG. 1 shows the integrated charge sensing circuit 100 of an exemplary embodiment of the invention coupled to an exemplary memory cell 101 of an array of resistive memory cells arranged at the intersection of digit (column) line 105 and row line 112. Exemplary memory cell 101 is shown, addressed by row line 112 and digit line 105. Memory cell 101 includes an access transistor 102 and a resistor or resistive element 103 coupled to a voltage source of Vcc/2, where Vcc is a supply voltage. Voltage source Vcc/2 is also coupled to the non inverting input of comparator 107.

The digit line 105 is connected to an integrated memory element resistance measurement circuit 115. It is understood that while FIG. 1 only illustrates one resistive memory cell 101, the same principles described herein are equally applicable to a multitude of resistive memory cells, arranged in an array. Also, although the invention has been described with a resistive random access memory element accessed with an access transistor, the invention will also operate with other types of memory and other access schemes, such as a crosspoint array.

In accordance with the illustrated embodiment, digit line 105 is connected to a respective integrated memory element resistance measurement circuit 115 through a column select transistor 104. Alternately, a single measurement circuit 115 may be multiplexed among a plurality of digit lines. Measurement circuit 115 includes a comparator 107 for measuring the current through memory cell 101, which is stored as a voltage on a digit line capacitor 106. Comparator 107 is provided with an offset voltage, Vos at the input receiving the Vcc/2 voltage as a reference input. In accordance with the FIG. 1 embodiment, comparator 107 makes a comparison between the voltage on digit line 105 and the reference voltage $$\frac{V_{CC}}{2} - V_{OS}$$

when the leading edge of clock signal $\Phi_2$ from clock source 120 goes high. When the voltage on digit line 105 exceeds $$\frac{V_{CC}}{2} - V_{OS},$$

the output of a comparator 107 switches high. The high output of comparator 107 closes a switch 109, causing some of the charge stored on digit line capacitor 106 to be transferred onto a capacitor 108. When the voltage on the digit line 105 falls below $$\frac{V_{CC}}{2} - V_{OS},$$

and the comparator 107 is again operated by the clock signal $\Phi_2$, comparator 107 will switch low, opening switch 109 and closing switch 110, causing charge on capacitor 108 to pass to ground. The comparator is also turned off (i.e., output goes low) by the falling edge of clock $\Phi_2$.

This process of discharging and recharging capacitor 106 continues for a predetermined period of time. The time taken to recharge capacitor 106 during these cycles will depend on the resistance of memory cell 101 and is reflected in the time period of the "high" and "low" states of comparator 107. It is noted that each digit line in an array has some inherent capacitance and can be charged by the current conducted through each respective memory cell. Accordingly, capacitor 106 may be a discrete capacitor, parasitic capacitance of the digit line 105 or a combination of the two. In the embodiment shown in FIG. 1, switch 110 may also be operated by a complementary non-overlapping clock signal $\Phi_1$ having pulses which interleave those of clock signal $\Phi_2$.

The switching and discharging of capacitor 108 is implemented with switches 109 and 110 which, as shown in FIG. 1, act together to either connect feedback capacitor 108 to digit line 105 or alternatively connect feedback capacitor 108 to ground (to discharge the capacitor between cycles), depending upon the output state of comparator 107. Those skilled in the art will appreciate, with the benefit of the present description, that the switching function can be implemented in numerous different circuits and is not limited to two switches. Circuit 100 further includes a cycle counter 130, controlled by an enable signal (ENABLE) that counts the number of times that the comparator 107 goes high during a predetermined period of time. The count is inversely proportional to the current and thus to the resistance of the memory element 103 being reead.

A digital value comparison is performed on the value stored in cycle counter 130 by a digital value comparison device 131 to determine if the counted value (and thus the memory cell resistance) is within a specified range. Digital value comparison device 131 performs a comparison of the cycle counter 130 in any one of several ways, for example by comparing the value against a threshold or as a ratio of the number of times the comparator 107 goes high over a total number of sensing cycles. Counter 130 may alternately count the low state of comparator 107. Counter 130 may also count the amount of time the output of the comparator 107 is high or low based on a sampling rate.

Still further, the output of comparator 107 can supply "up" and "down" signals as control inputs to an up/down counter, which counts a clock signal. Here again, the count value in the counter 130 represents the resistance of the memory cell, which can be compared to a threshold to determine if the count value is higher or lower than the threshold and thus provide an indication of the logical state of the memory element 103. If the sensed resistance in the memory cell is above the threshold, a logic "high" signal is outputted. Conversely, if the sensed resistance is below the threshold, a logic "low" signal is outputted.

Figure 2:
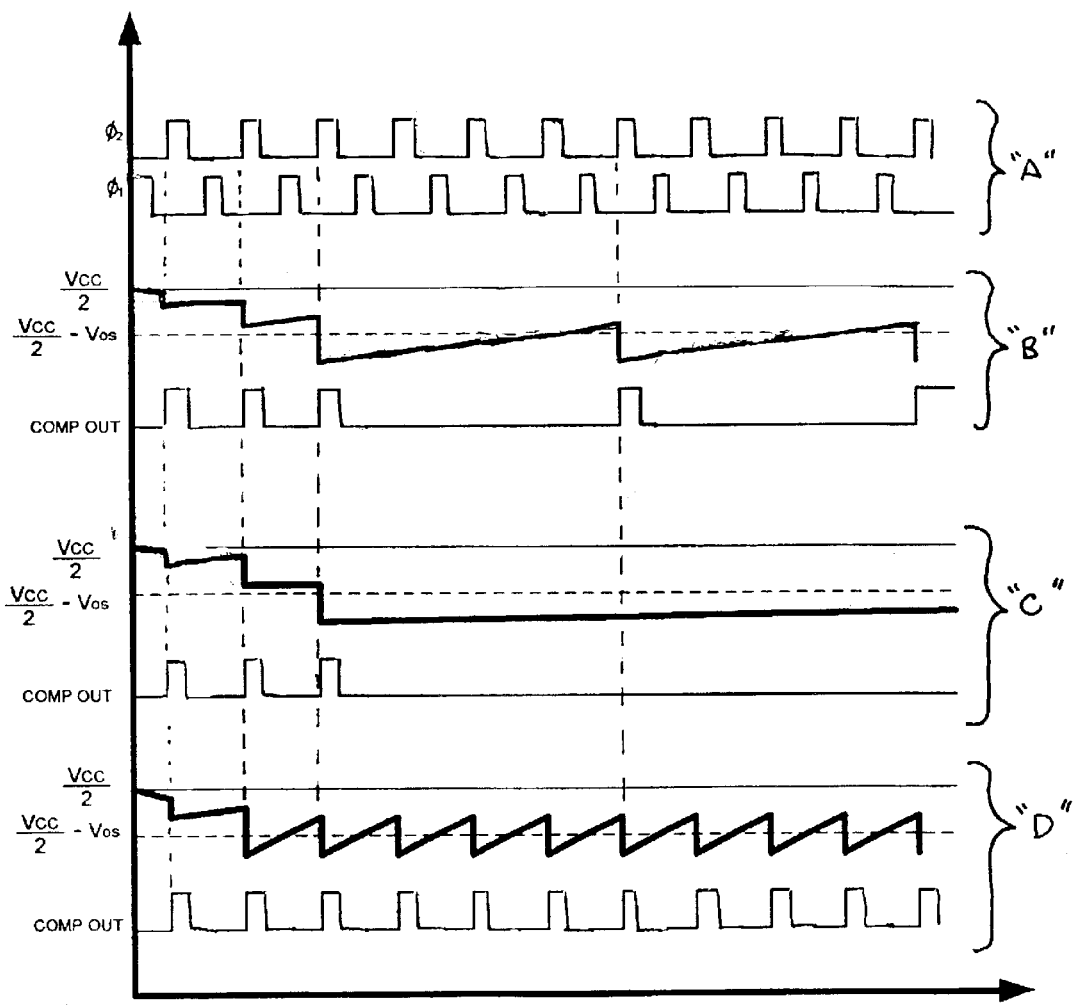
FIGS. 2A–D are timing diagrams, illustrating operation of the circuit in FIG. 1.

FIG. 2 is a set of timing diagrams for the operation of the integrated charge sensing circuit 100 of FIG. 1. FIG. 2A shows $\Phi_1$ and $\Phi_2$ as two complementary and non-overlapping clock signals.

Three distinct examples of the circuit operation are depicted in FIGS. 2B, 2C and 2D. In the bottommost example of FIG. 2D, the resistance of the memory element 103 is small. In this instance, the voltage on digit line 105 (bold line) is pulled quickly to Vcc/2 because there is very little resistance, which limits how fast digit line capacitor 106 charges. This causes comparator 107 output (COMP OUT) to go high frequently during the charges and discharges of capacitor 106 over a predetermined measurement period. The comparator 107 output, therefore, mimics the clock signal $\Phi_2$. If the resistance is very small, so low that digit line 105 can never be pulled below the $$\frac{V_{CC}}{2} - V_{OS}$$

threshold, then the output of comparator 107 will go high every time the comparator is clocked.

In the middle example of FIG. 2C, the resistance in the memory cell is very large. In this instance, digit line 105 is quickly pulled low to below $$\frac{V_{CC}}{2} - V_{OS}.$$

Because of the high resistance the digit line charges very slowly back to Vcc/2, which causes comparator 107 output to remain low most of the time.

In the topmost example of FIG. 2B, the resistance of the memory cell is in an intermediate range. Comparator 107 performs comparison operations on the rising edge of $\Phi_2$ and a comparison is made between digit line 105 and $$\frac{V_{CC}}{2} - V_{OS}.$$

If digit line 105 voltage is greater than $$\frac{V_{CC}}{2} - V_{OS},$$

the output of comparator 107 goes high. If digit line 105 voltage is less than $$\frac{V_{CC}}{2} - V_{OS},$$

the output of comparator 107 remains low. The output of comparator 107 feeds clocked counter 130. The comparison operation on the rising edge of $\Phi_2$ is indicated by the dotted lines on FIG. 3. That is, at the rising edge of the first three pulses of $\Phi_2$, a comparison is made and the digit line is greater than $$\frac{V_{CC}}{2} - V_{OS}.$$

At the rising edge of the next (fourth) $\Phi_2$ pulse, another comparison is made, and the digit line is less than $$\frac{V_{CC}}{2} - V_{OS}.$$

It is noted, in all instances that when a comparator 107 output goes high, current through the digit line capacitor 106 is discharged to capacitor 108, resulting in a voltage drop at the digit line input of comparator 107. The current through the resistance of the memory element 103 then pulls the digit line voltage back up towards Vcc/2. As shown in FIG. 2D, the voltage gets pulled back above $$\frac{V_{CC}}{2} - V_{OS}$$

quickly, whereas in FIG. 2C, the resistance is so great that it takes a very long time to pull the voltage up over the threshold level of $$\frac{V_{CC}}{2} - V_{OS}.$$

The continuous string of "high" outputs from comparator 107 in the FIG. 2D example and the continuous string of "low" outputs from the comparator 107 in the FIG. 2C example require a high capacity counting circuit 130. Since the high and low outputs of comparator 107 are in response to the clock signal $\Phi_2$, a large number of continuous high and low states indicate that the clock $\Phi_2$ frequency is not well matched to the resistance values of memory element 103.

Figure 3:
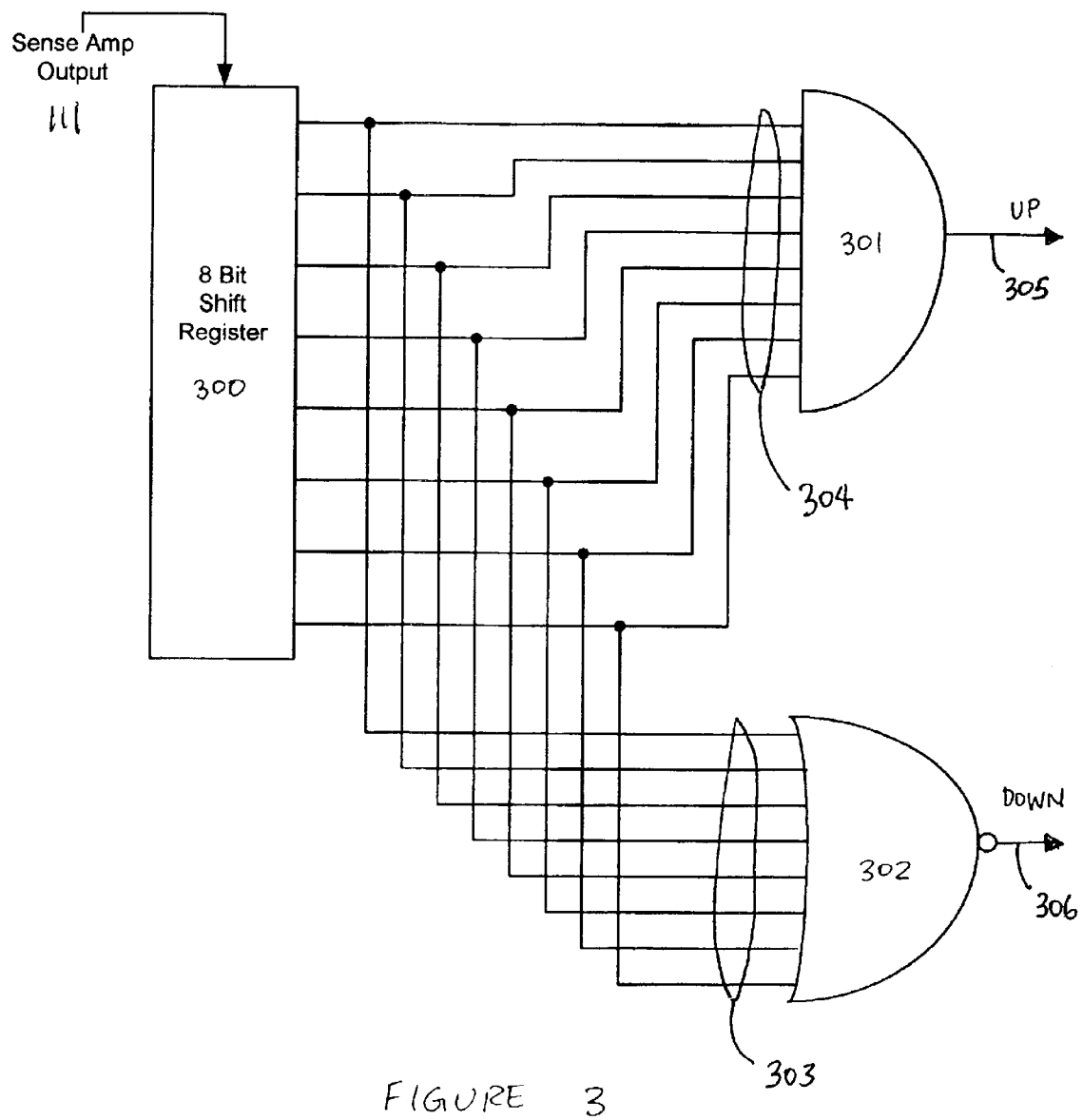
FIG. 3 is a circuit that determines a saturation condition from the output of the FIG. 1 circuit.

Turning to FIG. 3, an exemplary embodiment of the invention is shown in which the output 111 from the FIG. 1 comparator 107 is being input to 8-bit shift register 300. Each output (303, 304) from the shift register is coupled to an 8-input AND logic gate 301 and an 8-input NOR logic gate 302. It is understood that, while an 8-bit configuration is disclosed in the exemplary embodiment, other configurations (e.g., 4 it, 16 bit, etc.) are equally applicable.

When shift register 300 receives the output 111 from the comparator 107, the register stores the outputs and transmits them along inputs 304 and 303 to AND gate 301 and NOR gate 302, respectively. AND gate 301 outputs a high logic signal ("1") when all the lines are logic "high," while NOR gate 302 outputs a high logic signal ("1") when all the lines are logic "low." A high output 305 from AND gate 301 indicates that the comparator 107 is producing a large number of successive high output states (as in FIG. 2D) and that the clock speed is too slow. Similarly, a logic "high" output from NOR gate 302 indicates that the comparator 107 is outputting a large number of successive low states (as in FIG. 2C) and that the clock speed is accordingly too fast.

Figure 4:
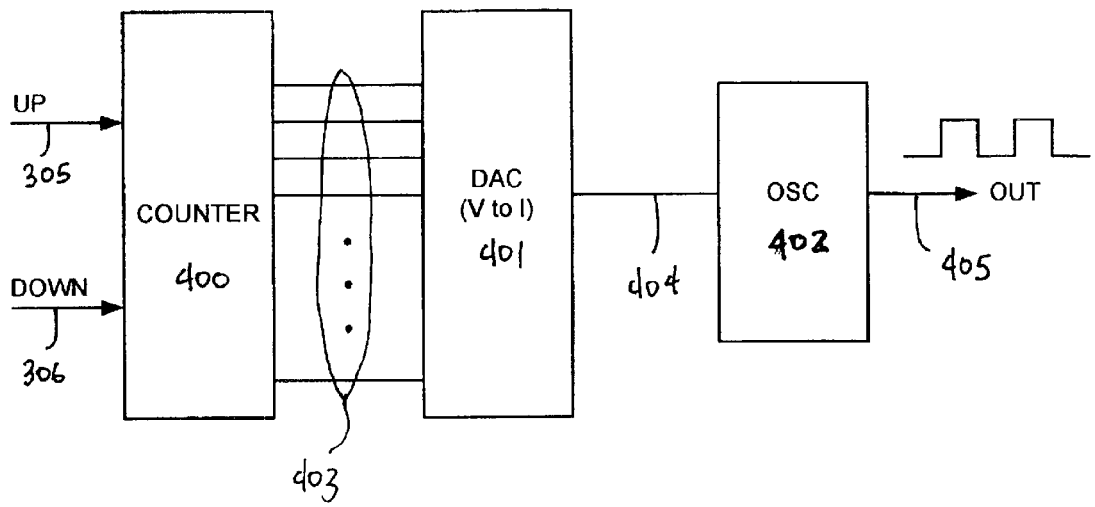
FIG. 4 is a block diagram of an oscillator/clock adjustment circuit.

Turning to FIG. 4, the outputs (305, 306) of AND gate 301 and NOR gate 302 are sent to counter 400, which stores an increment/decrement count of the AND and NOR gates 301 and 300. Counter 400 transmits a count 403 to digital-to-analog (DAC) converter 401, which converts the digital count value of counter 400 to a an analog control signal 404 which controls oscillator 402. Oscillator 402 receives the output signal 404, which indicates to the oscillator whether to increase or decrease the oscillator clock frequency. Oscillator 402 then appropriately adjusts the frequency of a clock output signal which is used to generate the complementary and non-overlapping $\Phi_1$ and $\Phi_2$ clock signals.

Furthermore, as discussed above in connection with FIG. 2A, $\Phi_1$ and $\Phi_2$ are two complementary and non-overlapping clock signals. In order to ensure that the clock signals $\Phi_1$ and $\Phi_2$ do not overlap, the output signal 405 is preferably processed through a non-overlapping clock signal generating circuit illustrated in FIG. 5.

Figure 5:
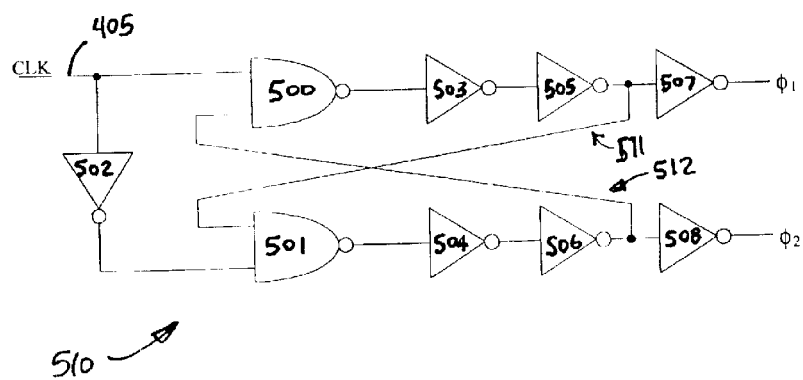
FIG. 5 is a schematic of a non-overlapping clock generation circuit.

Referring to FIG. 5, the oscillator clock output 405 is coupled to one terminal of NAND gate 500. The output signal 405 is also inverted via logic inverter 502 and connected to one terminal of NAND gate 501. The outputs of NAND gates 500 and 501 are each dually inverted via inverters 503, 505 and 504, 506, respectively. The outputs 511 and 512 of the dual inverters (503, 505 and 504, 506) are each coupled to a respective output inverter 507 and 508, and are also fed back respectively, in a cross-coupled fashion, to second terminals of NAND gates 501 and 500. Inverters 507 and 508 respectively output the non-overlapping clock signals $\Phi_1$ and $\Phi_2$ at each output. Thus, the exemplary embodiments of the invention provides a control of the frequency of clock signals $\Phi_1$ and $\Phi_2$ used to operate the resistive memory circuit 115 to reduce the number of successive high or low states of comparator 107 and thus reduce the required counting capacity of counter 130.

Figure 6:
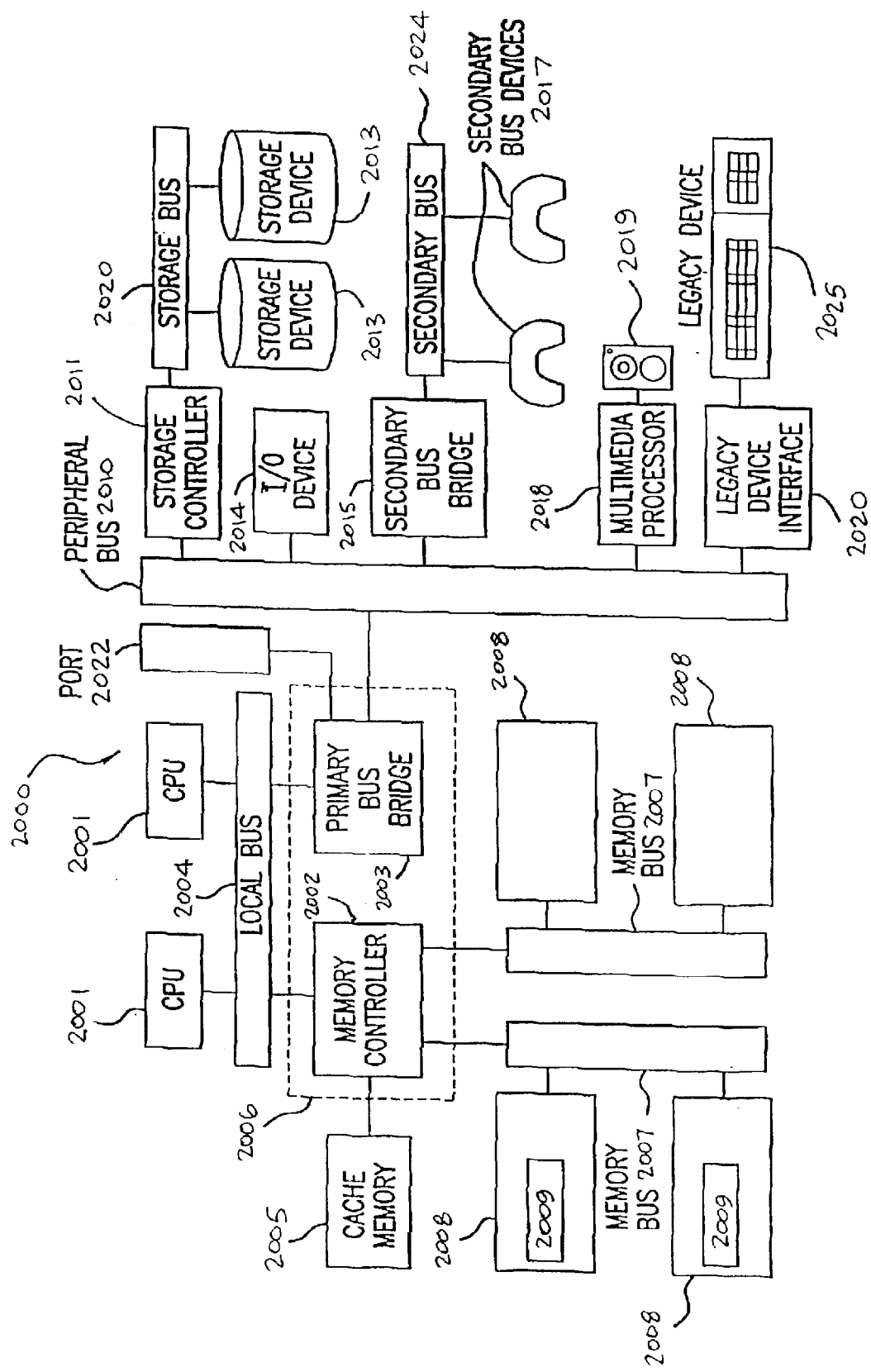
FIG. 6 depicts a block diagram of a processor system employing a resistive memory having a sensing and adjustment circuit in accordance with the invention.

FIG. 6 illustrates an exemplary processing system 2000 which utilizes a resistive sensing circuit such having clock frequency control as described in connection with FIGS. 1–5. The processing system 2000 includes one or more processors 2001 coupled to a local bus 2004. A memory controller 2002 and a primary bus bridge 2003 are also coupled the local bus 2004. The processing system 2000 may include multiple memory controllers 2002 and/or multiple primary bus bridges 2003. The memory controller 2002 and the primary bus bridge 2003 may be integrated as a single device 2006.

The memory controller 2002 is also coupled to one or more memory buses 2007. Each memory bus accepts memory components 2008. Any one of memory components 2008 may contain the clock-controlled resistive sensing circuit as described in connection with FIGS. 1–5.

The memory components 2008 may be a memory card or a memory module. The memory components 2008 may include one or more additional devices 2009. For example, in a SIMM or DIMM, the additional device 2009 might be a configuration memory, such as a serial presence detect (SPD) memory. The memory controller 2002 may also be coupled to a cache memory 2005. The cache memory 2005 may be the only cache memory in the processing system. Alternatively, other devices, for example, processors 2001 may also include cache memories, which may form a cache hierarchy with cache memory 2005. If the processing system 2000 include peripherals or controllers which are bus masters or which support direct memory access (DMA), the memory controller 2002 may implement a cache coherency protocol. If the memory controller 2002 is coupled to a plurality of memory buses 2007, each memory bus 2007 may be operated in parallel, or different address ranges may be mapped to different memory buses 2007.

The primary bus bridge 2003 is coupled to at least one peripheral bus 2010. Various devices, such as peripherals or additional bus bridges may be coupled to the peripheral bus 2010. These devices may include a storage controller 2011, a miscellaneous I/O device 2014, a secondary bus bridge 2015, a multimedia processor 2018, and a legacy device interface 2020. The primary bus bridge 2003 may also be coupled to one or more special purpose high speed ports 2022. In a personal computer, for example, the special purpose port might be the Accelerated Graphics Port (AGP), used to couple a high performance video card to the processing system 2000.

The storage controller 2011 couples one or more storage devices 2013, via a storage bus 2020, to the peripheral bus 2010. For example, the storage controller 2011 may be a SCSI controller and storage devices 2013 may be SCSI discs. The I/O device 2014 may be any sort of peripheral. For example, the I/O device 2014 may be a local area network interface, such as an Ethernet card. The secondary bus bridge may be used to interface additional devices via a secondary bus 2024 to the processing system. For example, the secondary bus bridge may be an universal serial port (USB) controller used to couple USB devices 2017 via to the processing system 2000. The multimedia processor 2018 may be a sound card, a video capture card, or any other type of media interface, which may also be coupled to one additional device such as speakers 2019. The legacy device interface 2020 is used to couple legacy devices 2025, for example, older styled keyboards and mice, to the processing system 2000.

The processing system 2000 illustrated in FIG. 6 is only an exemplary processing system with which the invention may be used. While FIG. 6 illustrates a processing architecture especially suitable for a general purpose computer, such as a personal computer or a workstation, it should be recognized that well known modifications can be made to configure the processing system 2000 to become more suitable for use in a variety of applications. For example, many electronic devices which require processing may be implemented using a simpler architecture which relies on a CPU 2001 coupled to memory components 2008 and/or memory devices 2009. The modifications may include, for example, elimination of unnecessary components, addition of specialized devices or circuits, and/or integration of a plurality of devices.

While the invention has been described in detail in connection with preferred embodiments known at the time, it should be readily understood that the invention is not limited to the disclosed embodiments. Rather, the invention can be modified to incorporate any number of variations, alterations, substitutions or equivalent arrangements not heretofore described, but which are commensurate with the spirit and scope of the invention. For example, although the invention has been described in connection with specific circuits employing different configurations of transistor circuits, the invention may be practiced with many other configurations without departing from the spirit and scope of the invention. Furthermore, the circuits of FIGS. 1 and 3–5 could be integrated on a single substrate, together with other appropriate circuitry. It is also understood that the logic structures described in the embodiments above can be replaced with equivalent logic structures to perform the disclosed methods and processes. Accordingly, the invention is not limited by the foregoing description or drawings, but is only limited by the scope of the appended claims.

What is claimed as new and desired to be protected by Letters Patent of the United States is:

1. A sense circuit for a resistive memory element, said sense circuit comprising:
    a resistive sensing circuit connected to a resistive memory element and operated by a clock signal to produce a digital value representing a sensed resistance; and
    a clock adjustment circuit, coupled to the output of said sensing circuit, for adjusting the operating frequency of said clock signal.

2. The sense circuit according to claim 1, wherein the resistive sensing circuit comprises a first capacitive element coupled to the resistive memory element and to a first input of a comparator circuit, said comparator circuit having a second input coupled to a reference voltage.

3. The sense circuit according to claim 2, wherein the resistive sensing circuit further comprises a second capacitive element, said second capacitive element being coupled to said first capacitive element through a switch, said switch operating to close when a voltage at the first input exceeds the reference voltage, and to open when a voltage at the first input is less than the reference voltage.

4. The sense circuit according to claim 3, wherein the resistive sensing circuit further comprises a second switch coupled between the second capacitive element and to ground, said switch operating to open when a voltage at the first input exceeds the reference voltage, and to close when a voltage at the first input is less than the reference voltage.

5. The sense circuit according to claim 1, wherein said clock adjustment circuit comprises a shift register for storing the output from the sensing circuit.

6. The sense circuit according to claim 5, wherein said clock adjustment circuit further comprises a logic structure that outputs a first adjusting signal when a successive string of logic ones are stored in said shift register, and outputs a second adjusting signal when a successive string of logic zeros are stored in said shift register.

7. The sense circuit according to claim 6, wherein said logic structure is comprised of a logic AND gate, and a logic NOR gate, said AND gate producing the first adjusting signal and said NOR gate producing said second adjusting signal, wherein the first adjusting signal increases the operating clock frequency, and the second adjustment signal decreases the operating clock frequency.

8. The sense circuit according to claim 6, wherein said clock adjustment circuit further comprises a counter, which counts the number of times the first and second adjustment signals are being outputted.

9. The sense circuit according to claim 8, wherein said clock adjustment circuit further comprises a digital to analog converter, for converting the digital count stored in said counter to an analog control signal.

10. The sense circuit according to claim 9, wherein said clock adjustment circuit further comprises an oscillator circuit that adjusts the operating frequency of said clock signal according to the analog control signal.

11. The circuit according to claim 10, wherein the clock adjustment circuit further comprises a non-overlapping clock generation circuit coupled to the oscillator circuit for supplying non-overlapping clock signals to said resistive sensing circuit.

12. A method for controlling a sensing circuit operated by a clock signal to produce a digital value representing a sensed resistance, comprising the steps of:
    determining if the sensing circuit is repeatedly outputting a predetermined number of identical values;
    producing an adjustment signal if it is determined that the sensing circuit is repeatedly outputting a predetermined number of identical values; and
    adjusting the frequency of said clock signal based on the adjustment signal.

13. The method according to claim 12, wherein the repeated digital value outputs are repeated logic "high" outputs.

14. The method according to claim 13, wherein the repeated digital value outputs are repeated logic "low" outputs.

15. The method according to claim 13, wherein the step of determining if the sensing circuit is repeatedly outputting a predetermined number of identical values comprises storing the values in a register and performing a logic operation on the stored values, said logic operation producing the adjustment signal.

16. The method according to claim 15, wherein the adjustment signal is converted to an analog signal and used to change a frequency of the clock signal.

17. A sense circuit for a resistive memory element, comprising;
    a sensing circuit, having an input terminal connected to said resistive memory element and a reference terminal connected to a reference voltage, said sensing circuit providing successive output signals which represent a resistance of said memory element when said sensing circuit is connected thereto;

a shift register, coupled to the output of said sensing device for receiving said successive output signals;

at least one logic gate coupled to the output of said register for detecting a predetermined pattern in said successive output signals;

a circuit coupled to said at least one logic gate for producing a control signal when said predetermined pattern is detected; and a variable oscillator providing a clock signal to said sensing circuit and responsive to said control signal to vary the frequency of said clock signal.

18. The sense circuit according to claim 17, wherein the sensing circuit comprises a first capacitive element coupled to the resistive memory element and to the input terminal, said input terminal being further coupled to a comparator circuit.

19. The sense circuit according to claim 18, wherein the sensing circuit further comprises a second capacitive element, said second capacitive element being coupled to said first capacitive element through a switch, said switch operating to close when a voltage at the input terminal exceeds a reference voltage, and to open when a voltage at the input terminal is less than the reference voltage.

20. The sense circuit according to claim 19, wherein the sensing circuit further comprises a second switch coupled between the second capacitive element and to ground, said second switch operating to open when a voltage at the input terminal exceeds the reference voltage, and to close when a voltage at the input terminal is less than the reference voltage.

21. The sense circuit according to claim 17, further comprising a logic structure that outputs a first adjusting signal when a successive string of logic ones are stored in said shift register, and outputs a second adjusting signal when a successive string of logic zeros are stored in said shift register.

22. The sense circuit according to claim 21, wherein said logic structure is comprised of a logic AND gate, and a logic NOR gate.

23. The sense circuit according to claim 22, further comprising a counter, which counts the number of times the first and second adjustment signals are being outputted.

24. The sense circuit according to claim 23, wherein said detection circuit further comprises a digital to analog converter, for converting the digital count stored in said counter to an analog control signal.

25. The sense circuit according to claim 17, further comprising a non-overlapping clock generation circuit coupled to the variable oscillator for supplying non-overlapping clock signals to said sensing circuit.

26. A method for operating a resistance sensing circuit, comprising the steps of:

receiving a predetermined number of outputs from said resistance sensing circuit which is operated by a clock signal;

storing said predetermined number of outputs;

processing the predetermined of outputs to determine whether the predetermined number of outputs includes only a first logic signal type or only a second logic signal type;

transmitting a signal to an oscillator to adjust the oscillation frequency of said clock signal in a first direction if the predetermined number of outputs includes only a first logic signal type; and transmitting a signal to an oscillator to adjust the oscillation frequency of said clock signal in a second direction if the predetermined number of outputs includes only a second logic signal type.

27. The method according to claim 26, wherein the step of storing said predetermined number of outputs comprises storing the predetermined number of outputs in a register.

28. The method according to claim 26, wherein the step of processing the predetermined number of outputs further comprises performing a logic operation on the stored outputs.

29. The method of claim 26, wherein the first logic signal type is a logic "high" signal.

30. The method of claim 27, wherein the second logic signal type is a logic "low" signal.

31. A circuit, comprising:

means for sensing the resistance of a resistive memory and transmitting a series of output signals indicating the resistance of said resistive memory;

means for detecting a predetermined number of a predetermined type of output from said sensing means and providing a detection output;

means for increasing or decreasing an operating frequency of said sensing means, depending on the detection output.

32. An integrated circuit comprising:

a substrate;

a sensing circuit formed on said substrate, said sensing circuit having an operating clock frequency;

a detection circuit formed on said substrate, said detection circuit being coupled to the output of said sensing circuit; and a clock adjustment circuit formed on said substrate, said clock adjustment circuit being coupled to the output of said detection circuit, wherein said clock adjustment circuit adjusts the operating clock frequency based on an adjustment signal received from the detection circuit.

33. The integrated circuit according to claim 32, wherein said sensing circuit is coupled to a resistive memory element.

34. The integrated circuit according to claim 33, wherein the sensing circuit receives a voltage produced by said resistive memory element, and senses the resistive state of said memory element.

35. The integrated circuit according to claim 33, wherein said detection circuit further comprises a shift register.

36. The integrated circuit according to claim 35, wherein said detection circuit further comprises a logic AND gate, coupled to the output of said shift register.

37. The integrated circuit according to claim 36, wherein the detection circuit further comprises a logic NOR gate, coupled to the output of said shift register.

38. The integrated circuit according to claim 32, wherein the clock adjustment circuit comprises a counter.

39. The integrated circuit according to claim 38, wherein the clock adjustment circuit further comprises a digital-to-analog converter, coupled to the output of said counter.

40. The system according to claim 39, wherein the clock adjustment circuit comprises a variable oscillator circuit, coupled to the output of said digital-to-analog converter.

41. The system according to claim 40, wherein the clock adjustment circuit further comprises a clock generation circuit for providing non-overlapping clock signals from the output of said sensing circuit.

* * * * *

UNITED STATES PATENT AND TRADEMARK OFFICE
CERTIFICATE OF CORRECTION

PATENT NO. : 6,985,375 B2
DATED : January 10, 2006
INVENTOR(S) : R. J. Baker

It is certified that error appears in the above-identified patent and that said Letters Patent is hereby corrected as shown below:

Column 3,
Line 30, delete "reead." and insert -- read. --;

Column 5,
Line 30, delete "4 it," and insert -- 4 bit, --;
Line 49, delete "to a an" and insert -- to an --;

Column 6,
Line 40, delete "include" and insert -- includes --;

Column 9,
Line 60, delete "predetermined of" and insert -- predetermined number of --.

Signed and Sealed this

Eleventh Day of April, 2006

JON W. DUDAS
*Director of the United States Patent and Trademark Office*